US012702042B2

(12) United States Patent
Wu et al.

(10) Patent No.: US 12,702,042 B2
(45) Date of Patent: Aug. 4, 2026

(54) BUMPS COMPRISING TIN, COOPER AND BISMUTH FOR LIQUID METAL SOCKET INTERCONNECTS

(71) Applicant: Intel Corporation, Santa Clara, CA (US)

(72) Inventors: Jiaqi Wu, Chandler, AZ (US); Xiao Lu, Chandler, AZ (US); Bohan Shan, Chandler, AZ (US); Valery Ouvarov-Bancalero, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 274 days.

(21) Appl. No.: 17/696,162

(22) Filed: Mar. 16, 2022

(65) Prior Publication Data

US 2023/0299024 A1 Sep. 21, 2023

(51) Int. Cl.
*H10B 43/27* (2023.01)
*B23K 1/00* (2006.01)
(Continued)

(52) U.S. Cl.
CPC ........... *H10W 72/90* (2026.01); *B23K 1/0008* (2013.01); *B23K 35/26* (2013.01); *H10W 72/20* (2026.01);
(Continued)

(58) Field of Classification Search
CPC ......... H01L 24/05–09; H01L 24/13–14; H01L 24/16–17; H01L 24/26; H01L 2224/04; H01L 2224/0401; H01L 23/49866; H01L 23/49811; H01L 23/49816; H01L 2224/13147; H01L 2224/13111; H01L 2224/13113; H01L 2224/28–29; H01L 2224/29099; H01L 2224/29194; H01L 2224/29694; H05K 3/32; H05K 3/34; H05K 3/341; H05K 3/3421; H05K 3/3426; H05K 3/3436; H05K 3/3463; H05K 3/3457;
(Continued)

(56) References Cited

U.S. PATENT DOCUMENTS

| | | | | |
|---|---|---|---|---|
| 7,939,945 | B2 * | 5/2011 | Sauciuc | ............... H05K 3/3463 |
| | | | | 257/E21.597 |
| 10,624,206 | B2 * | 4/2020 | Sugaya | ................ H05K 3/4038 |

(Continued)

OTHER PUBLICATIONS

Ramli, "Influence of 1.5 wt. % Bi on the Microstructure, Hardness, and Shear Strength of Sn-0.7Cu Solder Joints after Isothermal Annealing" Published: Sep. 7, 2021 Ramli (Year: 2021).*

(Continued)

*Primary Examiner* — Wael M Fahmy
*Assistant Examiner* — Aneesa Riaz Baig
(74) *Attorney, Agent, or Firm* — Alliance IP, LLC

(57) ABSTRACT

In one embodiment, an integrated circuit apparatus comprises a substrate that includes electrical contacts on a first side of the substrate to couple the substrate to an integrated circuit die, a passivation layer on a second side of the substrate opposite the first side, metal pads on the second side of the substrate and within openings defined by the passivation layer, and solder bumps on the metal pads. The solder bumps are a material that is resistant to Gallium-based liquid metal embrittlement.

15 Claims, 6 Drawing Sheets

(51) Int. Cl.

| | |
|---|---|
| *B23K 35/26* | (2006.01) |
| *B23K 101/40* | (2006.01) |
| *G11C 11/408* | (2006.01) |
| *G11C 11/412* | (2006.01) |
| *G11C 11/418* | (2006.01) |
| *H01L 21/768* | (2006.01) |
| *H01L 23/48* | (2006.01) |
| *H01L 25/00* | (2006.01) |
| *H01L 25/065* | (2023.01) |
| *H10B 41/27* | (2023.01) |
| *H10B 41/30* | (2023.01) |
| *H10B 41/35* | (2023.01) |
| *H10B 43/30* | (2023.01) |
| *H10B 43/35* | (2023.01) |
| *H10D 1/00* | (2025.01) |
| *H10D 1/68* | (2025.01) |
| *H10D 30/01* | (2025.01) |
| *H10D 30/67* | (2025.01) |
| *H10D 64/27* | (2025.01) |
| *H10W 72/00* | (2026.01) |
| *H10W 72/20* | (2026.01) |
| *H10W 72/29* | (2026.01) |
| *H10W 72/90* | (2026.01) |
| *H10W 80/00* | (2026.01) |
| *H10W 90/00* | (2026.01) |

(52) U.S. Cl.
CPC ......... *B23K 2101/40* (2018.08); *H10W 72/29* (2026.01)

(58) Field of Classification Search
CPC ....... H05K 2201/10734; H10W 72/90; H10W 72/29; H10W 78/00; B23K 2101/40
See application file for complete search history.

(56) References Cited

U.S. PATENT DOCUMENTS

| | | | | |
|---|---|---|---|---|
| 11,335,798 | B2 * | 5/2022 | Moens ................. | H10D 64/685 |
| 12,230,564 | B2 * | 2/2025 | Marin ..................... | H01L 24/16 |

| | | | | |
|---|---|---|---|---|
| 2003/0129822 | A1 * | 7/2003 | Lee ..................... | H01L 25/0657 |
| | | | | 257/E21.705 |
| 2005/0104222 | A1 * | 5/2005 | Jeong ................... | H05K 3/3436 |
| | | | | 257/784 |
| 2006/0102929 | A1 * | 5/2006 | Okamoto ............. | H10D 64/111 |
| | | | | 257/E29.127 |
| 2007/0052110 | A1 * | 3/2007 | Lu ........................... | H01L 24/29 |
| | | | | 257/E23.021 |
| 2009/0001576 | A1 * | 1/2009 | Tuli ................... | H01L 23/49827 |
| | | | | 257/E23.141 |
| 2012/0043591 | A1 * | 2/2012 | Takada ................ | H10D 30/015 |
| | | | | 257/288 |
| 2014/0151096 | A1 * | 6/2014 | Jiang ..................... | H01L 23/488 |
| | | | | 174/250 |
| 2017/0092609 | A1 * | 3/2017 | Yajima ................... | H01L 24/11 |
| 2018/0151495 | A1 * | 5/2018 | Hsu ........................ | H01L 24/17 |
| 2018/0358456 | A1 * | 12/2018 | Iucolano ............. | H10D 64/511 |
| 2020/0161261 | A1 * | 5/2020 | Jang ........................ | H01L 24/05 |
| 2020/0219987 | A1 * | 7/2020 | Lee ................... | H01L 21/02378 |
| 2020/0365543 | A1 * | 11/2020 | Shah ...................... | H01L 24/13 |
| 2021/0257486 | A1 * | 8/2021 | Wong .................... | H10D 64/01 |
| 2021/0392774 | A1 * | 12/2021 | Meyyappan ...... | H01L 23/49866 |
| 2022/0393006 | A1 * | 12/2022 | Shindome ........... | H10D 64/693 |
| 2023/0187850 | A1 * | 6/2023 | Lin .......................... | H01R 3/08 |
| | | | | 257/738 |
| 2023/0197659 | A1 * | 6/2023 | Ayalasomayajula .... | H01L 24/16 |
| | | | | 257/69 |
| 2023/0253288 | A1 * | 8/2023 | Adebiyi .............. | H01L 25/0655 |
| | | | | 257/687 |
| 2023/0299024 | A1 * | 9/2023 | Wu .................... | H01L 23/49866 |
| | | | | 257/737 |
| 2025/0048668 | A1 * | 2/2025 | Meng .................. | H10D 30/015 |

OTHER PUBLICATIONS

Nguena, E., et al. "Ga liquid metal embrittlement for fine pitch interconnect rework." 2017 IEEE 67th Electronic Components and Technology Conference (Ectc). IEEE, 2017; 1585-1591; 8 pages.

Nguena, Elodie, et al. "A kinetic study of liquid gallium diffusion in a tin-based solder alloy and its role in solder embrittlement." Journal of Materials Science 56.11 (2021): 7129-7141; 13 pages.

Nguena, Elodie, et al. "Gallium liquid metal embrittlement of tin-based solder alloys." Metallurgical and Materials Transactions A 51.12 (2020): 6222-6233; 12 pages.

* cited by examiner

302 — Form package substrate with trenches surrounding metal contact pads

304 — Attach die to package opposite metal contact pads

306 — Deposit TIM on die

308 — Attach cap to package

310 — Form bumps comprising Sn, Bi, Cu on metal pads of package

312 — Reflow with $N_2$

314 — Attach package substrate to LM interposer

316 — Attach package to LM socket on main board

400

402

402

600

PROCESSOR UNIT
602

COMMUNICATION COMPONENT
612

MEMORY
604

BATTERY/POWER
614

DISPLAY DEVICE
606

GNSS DEVICE
618

AUDIO OUTPUT DEVICE
608

AUDIO INPUT DEVICE
624

AN OTHER OUTPUT DEVICE
610

AN OTHER INPUT DEVICE
620

ANTENNA 622

BUMPS COMPRISING TIN, COOPER AND BISMUTH FOR LIQUID METAL SOCKET INTERCONNECTS

BACKGROUND

Tin (Sn)-based solder is a widely used bumping material in semiconductor packaging. However, Gallium (Ga) based liquid metal is known to embrittle Tin, as the liquid metal diffuses into the Tin solder and induces recrystallization.

DETAILED DESCRIPTION

Figure 1:
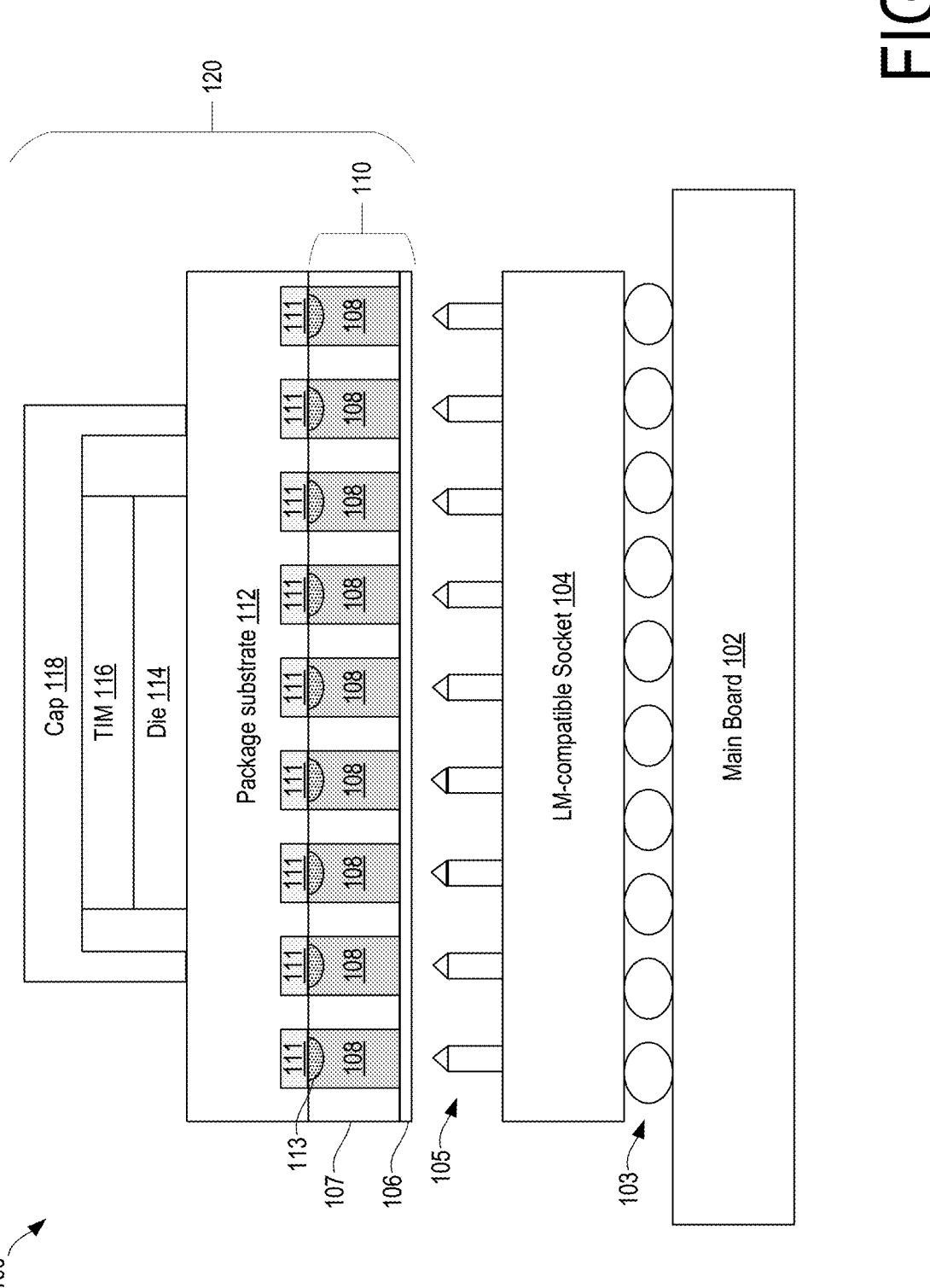
FIG. 1 illustrates an example integrated circuit device assembly that utilizes a liquid metal (LM) socket interconnect in accordance with embodiments of the present disclosure.

In embodiments herein, integrated circuit device assemblies may utilize liquid metal (LM) socket interconnects. The LM socket interconnects may utilize metal pads on the backside of a package substrate along with a Gallium (Ga)-based LM alloy in an interposer device to provide a low insertion force and low contact resistance interface between the package and a socket on a main board (e.g., a motherboard).

In some instances, the LM in the interposer device may protrude so that the LM comes fills wells on the backside of the package substrate in which the metal pads are located, and accordingly comes in contact with the pads. However, the LM protrusion height must be tightly controlled (e.g., with standard deviation below a few microns) to avoid open or short failures when it is bonded into the shallow wells on the substrate. Considering the nature of the LM material (i.e., high surface tension, tends to smear during process, etc.) and variations in the LM interposer filling process, it is very challenging to achieve the technical target on the protrusion height control.

Thus, embodiments herein provide a novel bumping process and a novel design of the wells of the package that contain the metal pads. The bumping process may be performed more near the end of the package assembly process as compared with traditional package assembly processes, as the protrusions on the metal pads could potentially cause issues for upstream process such as chip attach and lid attach. In some instances, the bumping process temperature may be as low as possible to reduce thermal impact to the device and avoid re-melting solders in FLI, DSC and STEVE Further, to avoid bridging of the LM, the wells of the substrate containing the metal pads may include a surrounding trench that can accommodate excessive LM volume.

Tin (Sn)-based solder is a widely used bumping material in semiconductor packaging. However, Gallium (Ga) based liquid metal is known to embrittle Tin, as the liquid metal diffuses into the Tin solder and induces recrystallization. The microstructure of the Tin bumps may transform from bulky grains into small grains, and the Gallium element segregates at the boundaries between the small grains such that the mechanical integrity of the bump is significantly reduced (e.g., both strength and ductility may be reduced by more than 70%). Accordingly, embodiments herein may utilize a novel bumping material system and process to solve the issues associated with LM embrittlement and mitigate the risk induced by high temperatures.

In particular, embodiments herein may include one or more of the following aspects. First, a bump paste may be used that is resistant to LM penetration and embrittlement. For example, a paste that includes Tin (Sn), Copper (Cu), and Bismuth (Bi) may be used. The Sn—Cu—Bi paste may be converted to an intermetallic compound (IMC) during a reflow process that involves Nitrogen gas ($N_2$) and heat. The resulting IMC may be conductive and highly resistive to LM penetration and embrittlement, especially compared to Sn alone. In addition, the backside of a package substrate may be designed to include trenches around metal contact pads, such that the trenches may contain any excessive LM flow that occurs during an attach process for the package substrate and LM interposer. Further, the bumping may be performed at or near the end of the package manufacturing/ assembly process than in traditional package assembly processes.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

FIG. 1 illustrates an example integrated circuit device assembly 100 that utilizes a liquid metal (LM) interconnect in accordance with embodiments of the present disclosure. In the example shown, the assembly 100 includes a main board 102, which may be a motherboard, system board, etc. The main board 102 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the main board 102. In other embodiments, the main board 102 may be a non-PCB substrate.

A LM-compatible socket 104 is coupled to the main board 102 via bumps 103. The bumps 103 may be formed using Tin or any other suitable bump material. In some embodiments, the LM-compatible socket 104 may be coupled to the main board 102 via other mechanisms.

The assembly 100 also includes a package 120 that includes a package substrate 112, an integrated circuit die 114 on the package substrate 112, a thermal interface material (TIM) 116 on the die 114, and a cap 118 enclosing the die 114 and TIM 116 on the top surface of the package substrate 112. The die 114 may be a packaged or unpacked integrated circuit product that includes one or more integrated circuit dies (e.g., the die 402 of FIG. 4, the integrated circuit device 500 of FIG. 5) and/or one or more other suitable components. The die 114 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the die 114 can comprise one or more additional active or passive devices such as capacitors, decoupling capacitors, resistors, inductors, fuses, diodes, transformers, sensors, electrostatic discharge (ESD) devices, and memory devices. In addition to comprising one or more processor units, the die 114 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

The package 120 also includes an interposer 110, which includes a housing 107 with holes that define LM reservoirs 108 (in which LM resides, e.g., a Ga-based LM), and a barrier 106 to prevent the LM from leaving the reservoirs 108. The package substrate 112 includes a set of metal contact pads 111 formed on the backside of the substrate, i.e., on the side opposite from the die 114. The metal pads 111 allow for electrical connections between the main board 102 and the die 114, via the socket 104, the LM 108 of the interposer 110, and traces within the package substrate 112. In addition, there are solder bumps 113 on the metal pads 111 and in contact with the LM 108 of the interposer 110. As disclosed herein, the solder bumps 113 are formed with a material resistant to LM embrittlement.

As shown, the LM-compatible socket 104 includes a set of interconnect pins 105 that include sharp ends as shown in FIG. 1. The pins 105 enable an electrical connection between the main board 102 and the die 114. The sharp ends of the interconnect pins 105 may be useful in piercing the barrier 106 of the interposer 110, causing the pins 105 to be in physical contact with the LM in the reservoirs 108, and to thus be in electrical contact with the metal pads 111 of the package substrate 112. As described above, embodiments herein may include a novel bumping material and formation process. The bumps may be formed on the metal pads 111 and used as an electrical connection between the pads 111 and the LM in the reservoirs 108. In addition, embodiments herein may utilize a novel package substrate 112 that includes trenches surrounding the metal pads 111. Finally, embodiments, herein may utilize a novel manufacturing process that can be used to implement the package 120 of FIG. 1.

Figure 2:
FIG. 2 illustrates an example package substrate and LM interposer for use in a LM socket interconnect in accordance with embodiments of the present disclosure.
Figure 2:
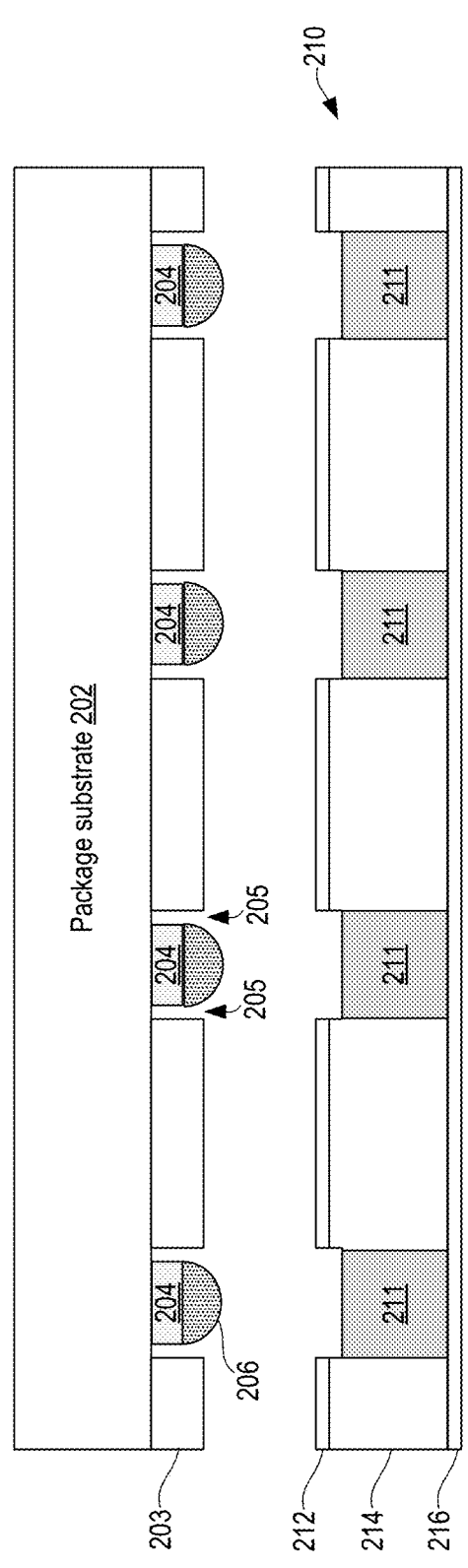

FIG. 2 illustrates an example package substrate 202 and LM interposer 210 for use in a LM socket interconnect in accordance with embodiments of the present disclosure. The package substrate 202 may be implemented in the same or similar manner as the package substrate 112 of FIG. 1. In the example shown, the package substrate 202 includes a passivation layer 203 on its backside. The passivation layer 203 may be a layer of dielectric material in certain embodiments. The package substrate 202 also includes a set of metal contact pads 204 formed on the backside as in FIG. 1, with the metal pads 204 being formed within openings of the passivation layer 203. As shown, the passivation layer 203 is thicker than the metal pads 204 such that it protrudes further from the backside surface of the package substrate 202 than the metal pads 204. The passivation layer 203 is formed such that it defines trenches 205 surrounding the metal pads 204. The trenches may allow for LM flow during attachment with the interposer 210 as described above.

As shown, there are bumps 206 formed on each of the metal pads 204. The bumps may be formed with a material that is resistive to LM penetration and embrittlement. For example, a paste that includes Tin (Sn), Copper (Cu), and Bismuth (Bi) may be used. The Sn—Cu—Bi paste may be converted to a conductive Cu—Sn intermetallic compound (IMC) during a reflow process that involves flow of a gas comprising Nitrogen gas ($N_2$) and heat as described below. The good resistance to LM embrittlement makes it ideal candidate for the bumping material for LM socketing application. Given that there are multiple application scenarios for LM to be applied electronic industry (i.e. thermal interface material, stretchable/flexible circuit), the application of this bumping material and process can be greatly extended.

The interposer 210 includes a barrier layer 216 similar to the barrier 106 of FIG. 1, and also includes a housing 214 filled with LM in its reservoirs 211 as described with respect to FIG. 1. In addition. The interposer 210 includes an adhesive layer 212 to help with adhesion to the passivation layer 203. In scenarios where bumps such as bumps 206 are not used, the LM may be required to be overfilled (i.e., filled in reservoirs 211 past the top surface of the housing 214 and/or the adhesive layer 212) to allow for connection with the metal pads 204 upon attachment with the package substrate 202.

However, as shown in FIG. 2, the bumps 206 may protrude further from the backside surface of the package substrate 202 than the passivation layer 203. The bump protrusion may allow for the LM to no longer be overfilled within the reservoirs 211 of the interposer 210. Thus, the LM may be filled to the surface of the interposer 210 or may be underfilled (i.e., below the surface of the interposer 210), either of which may provide good interconnection yields. The "flat" or underfilled surfaces may be easier to be made by LM printing/injection processes and may also not be susceptible to handling errors or issues.

In some embodiments, the height of the bumps 206 may be between approximately 100-150 um. The size of the trenches 205 may be tailored to contain excessive LM material at overfilled locations. The width of the trenches 205 may be approximately 50-100 um, in certain embodiments. In some instances, embodiments such as that shown in FIG. 2 may be expected to relax LM filling requirements by approximately 5 to 10 times from a standard deviation of between approximately 2-3 um to between approximately 10-20 um. The relaxation of the LM filling requirement can make the process friendly to high volume manufacturing (HVM) and high yielding.

Figure 3:
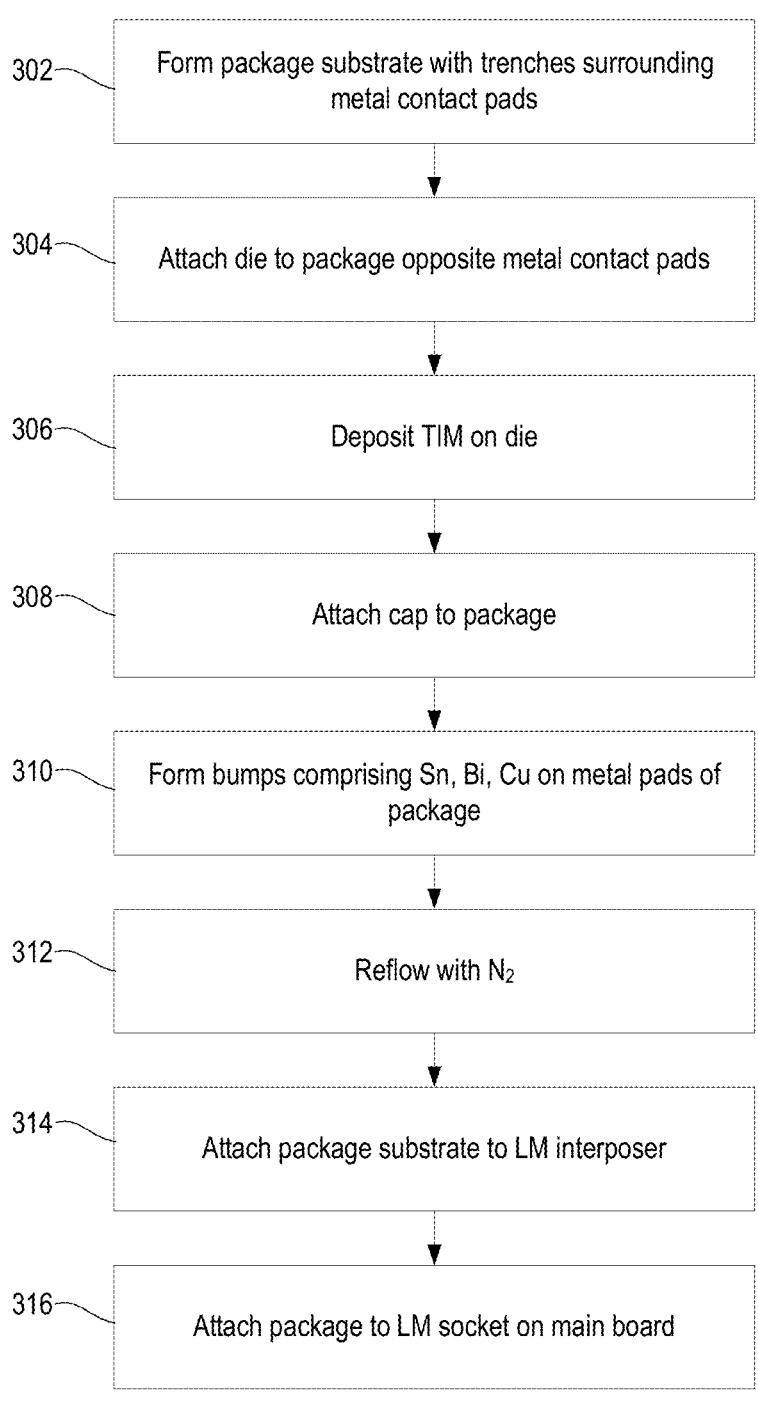
FIG. 3 illustrates an example process for manufacturing an integrated circuit device assembly that utilizes a liquid metal (LM) socket interconnect in accordance with embodiments of the present disclosure.

FIG. 3 illustrates an example process 300 for manufacturing an integrated circuit device assembly that utilizes a LM socket interconnect in accordance with embodiments of the present disclosure. The example process may include additional or different operations, and the operations may be performed in the order shown or in another order. In some cases, one or more of the operations shown in FIG. 3 are implemented as processes that include multiple operations, sub-processes, or other types of routines. In some cases, operations can be combined, performed in another order, performed in parallel, iterated, or otherwise repeated or performed another manner.

At 302, a package substrate (e.g., 112, 202) is formed with metal contact pads (e.g., 111, 204) on a backside (i.e., opposite a side of the substrate that is to connect to an integrated circuit die). This includes the formation of a passivation layer (e.g., 203) on the backside, and forming openings within the passivation layer (e.g., via etching) wherein the metal pads are then formed. The passivation layer may be formed such that it is thicker than the metal pads, i.e., so that the passivation layer protrudes further from the backside surface of the substrate that the metal pads, e.g., as shown in FIG. 2. Further, the passivation layer and metal pads may be formed such that trenches (e.g., 205) are defined around the metal pads, e.g., as shown in FIG. 2. The trenches may allow for overflow of LM later on when the substrate is attached to an LM interposer device. At 304, an integrated circuit die (e.g., 114) is attached to the package substrate. At 306, a thermal interface material (TIM) (e.g., 116) is deposited on the die, and at 308, a cap (e.g., 118) is attached to the package substrate to enclose the TIM and the die.

At 310, bumps (e.g., 206) are formed on the metal pads on the backside of the package substrate by depositing a bump paste on the metal pads. The bumps may be formed with a material that is resistant to LM penetration/embrittlement. For example, the bumps may be formed from a paste that includes Sn, Bi, and Cu, which can then form a Sn—Cu IMC that is resistant to LM penetration/embrittlement. The paste can be made from Sn—Bi and Cu that are mixed with a desired atomic ratio according to the desired stoichiometry of the Sn—Cu IMC. The ratios of each material may be in the following ranges: approximately 20-40% Sn, approximately 20-40% Cu, and approximately 20-40% Bi (where the sum is 100%). The addition of Bi may be to reduce the liquidus temperature during the reflow at 312, since Sn—Bi systems start to melt above 140° C. The Sn—Bi—Cu paste may be applied on top of the metal pad, e.g., through a printing, dipping, or jetting process.

At 312, a reflow is performed on the Sn—Bi—Cu paste with a gas comprising Nitrogen gas ($N_2$), and may be performed with a peak reflow temperature between approximately 180-250° C. The reflow process may convert the paste into the desired Sn—Cu IMC. Since the Bi does not form an IMC, it remains in the Bi domain in the final IMC matrix. In some embodiments, the reflow temperature can be decreased by adjusting the Sn/Bi ratio. For instance, lower reflow temperatures (e.g., approximately 150° C.) can be achieved when the when ratio of Sn—Bi is approximately 42% Sn, 58% Bi (where Cu represents 20-40% of the paste and the 42/58 split between the remaining percentage).

At 314, the package substrate is attached to a LM interposer (e.g., 210) to form an overall package, and at 316, the package is attached to an LM socket (e.g., 104) on a main board (e.g., 102).

Figure 4:
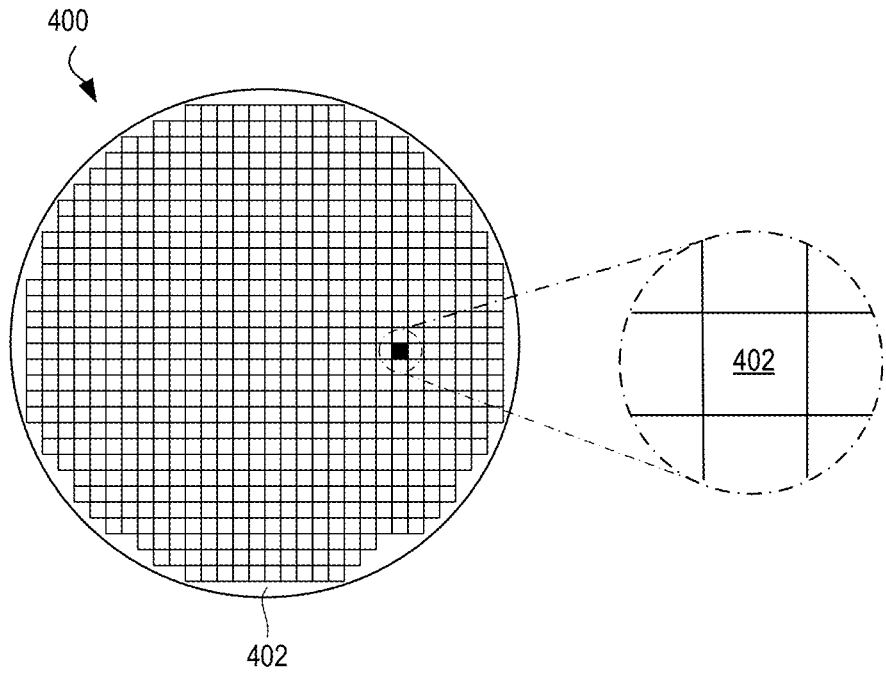
FIG. 4 is a top view of a wafer and dies that may be included in a microelectronic assembly, in accordance with any of the embodiments disclosed herein.

FIG. 4 is a top view of a wafer 400 and dies 402 that may incorporate any of the embodiments disclosed herein. The wafer 400 may be composed of semiconductor material and may include one or more dies 402 having integrated circuit structures formed on a surface of the wafer 400. The individual dies 402 may be a repeating unit of an integrated circuit product that includes any suitable integrated circuit. After the fabrication of the semiconductor product is complete, the wafer 400 may undergo a singulation process in which the dies 402 are separated from one another to provide discrete "chips" of the integrated circuit product. The die 402 may include one or more transistors (e.g., some of the transistors 540 of FIG. 5, discussed below), supporting circuitry to route electrical signals to the transistors, passive components (e.g., signal traces, resistors, capacitors, or inductors), and/or any other integrated circuit components. In some embodiments, the wafer 400 or the die 402 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 402. For example, a memory array formed by multiple memory devices may be formed on a same die 402 as a processor unit (e.g., the processor unit 602 of FIG. 6) or other logic that is configured to store information in the memory devices or execute instructions stored in the memory array.

Figure 5:
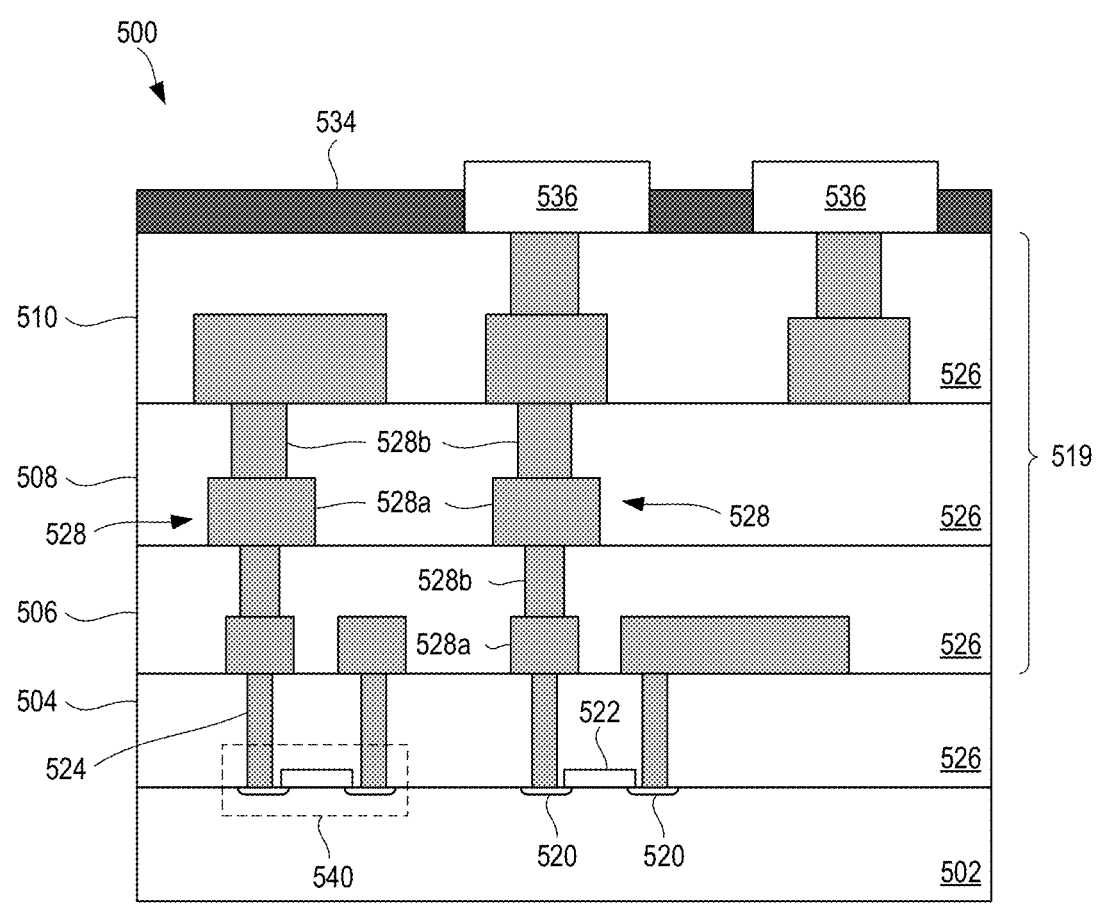
FIG. 5 is a cross-sectional side view of an integrated circuit device that may be included in a microelectronic assembly, in accordance with any of the embodiments disclosed herein.

FIG. 5 is a cross-sectional side view of an integrated circuit device 500 that may be included in any of the embodiments disclosed herein. One or more of the integrated circuit devices 500 may be included in one or more dies 402 (FIG. 4). The integrated circuit device 500 may be formed on a die substrate 502 (e.g., the wafer 400 of FIG. 4) and may be included in a die (e.g., the die 402 of FIG. 4). The die substrate 502 may be a semiconductor substrate composed of semiconductor material systems including, for example, n-type or p-type materials systems (or a combination of both). The die substrate 502 may include, for example, a crystalline substrate formed using a bulk silicon or a silicon-on-insulator (SOI) substructure. In some embodiments, the die substrate 502 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 502. Although a few examples of materials from which the die substrate 502 may be formed are described here, any material that may serve as a foundation for an integrated circuit device 500 may be used. The die substrate 502 may be part of a singulated die (e.g., the dies 402 of FIG. 4) or a wafer (e.g., the wafer 400 of FIG. 4).

The integrated circuit device 500 may include one or more device layers 504 disposed on the die substrate 502. The device layer 504 may include features of one or more transistors 540 (e.g., metal oxide semiconductor field-effect transistors (MOSFETs)) formed on the die substrate 502. The transistors 540 may include, for example, one or more source and/or drain (S/D) regions 520, a gate 522 to control current flow between the S/D regions 520, and one or more S/D contacts 524 to route electrical signals to/from the S/D regions 520. The transistors 540 may include additional features not depicted for the sake of clarity, such as device isolation regions, gate contacts, and the like. The transistors 540 are not limited to the type and configuration depicted in FIG. 5 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

Returning to FIG. 5, a transistor 540 may include a gate 522 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 540 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 540 along the source-channel-drain direction, the gate electrode may consist of a U-shaped structure that includes a bottom portion substantially parallel to the surface of the die substrate 502 and two sidewall portions that are substantially perpendicular to the top surface of the die substrate 502. In other embodiments, at least one of the metal layers that form the gate electrode may simply be a planar layer that is substantially parallel to the top surface of the die substrate 502 and does not include sidewall portions substantially perpendicular to the top surface of the die substrate 502. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 520 may be formed within the die substrate 502 adjacent to the gate 522 of individual transistors 540. The S/D regions 520 may be formed using an implantation/diffusion process or an etching/deposition process, for example. In the former process, dopants such as boron, aluminum, antimony, phosphorous, or arsenic may be ion-implanted into the die substrate 502 to form the S/D regions 520. An annealing process that activates the dopants and causes them to diffuse farther into the die substrate 502 may follow the ion-implantation process. In the latter process, the die substrate 502 may first be etched to form recesses at the locations of the S/D regions 520. An epitaxial deposition process may then be carried out to fill the recesses with material that is used to fabricate the S/D regions 520. In some implementations, the S/D regions 520 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 520 may be formed using one or more alternate semiconductor materials such as germanium or a group III-V material or alloy. In further embodiments, one or more layers of metal and/or metal alloys may be used to form the S/D regions 520.

Electrical signals, such as power and/or input/output (I/O) signals, may be routed to and/or from the devices (e.g., transistors 540) of the device layer 504 through one or more interconnect layers disposed on the device layer 504 (illustrated in FIG. 5 as interconnect layers 506-510). For example, electrically conductive features of the device layer 504 (e.g., the gate 522 and the S/D contacts 524) may be electrically coupled with the interconnect structures 528 of the interconnect layers 506-510. The one or more interconnect layers 506-510 may form a metallization stack (also referred to as an "ILD stack") 519 of the integrated circuit device 500.

The interconnect structures 528 may be arranged within the interconnect layers 506-510 to route electrical signals according to a wide variety of designs; in particular, the arrangement is not limited to the particular configuration of interconnect structures 528 depicted in FIG. 5. Although a particular number of interconnect layers 506-510 is depicted in FIG. 5, embodiments of the present disclosure include integrated circuit devices having more or fewer interconnect layers than depicted.

In some embodiments, the interconnect structures 528 may include lines 528a and/or vias 528b filled with an electrically conductive material such as a metal. The lines 528a may be arranged to route electrical signals in a direction of a plane that is substantially parallel with a surface of the die substrate 502 upon which the device layer 504 is formed. For example, the lines 528a may route electrical signals in a direction in and out of the page and/or in a direction across the page from the perspective of FIG. 5. The vias 528b may be arranged to route electrical signals in a direction of a plane that is substantially perpendicular to the surface of the die substrate 502 upon which the device layer 504 is formed. In some embodiments, the vias 528b may electrically couple lines 528a of different interconnect layers 506-510 together.

The interconnect layers 506-510 may include a dielectric material 526 disposed between the interconnect structures 528, as shown in FIG. 5. In some embodiments, dielectric material 526 disposed between the interconnect structures 528 in different ones of the interconnect layers 506-510 may have different compositions; in other embodiments, the composition of the dielectric material 526 between different interconnect layers 506-510 may be the same. The device layer 504 may include a dielectric material 526 disposed between the transistors 540 and a bottom layer of the metallization stack as well. The dielectric material 526 included in the device layer 504 may have a different composition than the dielectric material 526 included in the interconnect layers 506-510; in other embodiments, the composition of the dielectric material 526 in the device layer 504 may be the same as a dielectric material 526 included in any one of the interconnect layers 506-510.

A first interconnect layer 506 (referred to as Metal 1 or "M1") may be formed directly on the device layer 504. In some embodiments, the first interconnect layer 506 may include lines 528a and/or vias 528b, as shown. The lines 528a of the first interconnect layer 506 may be coupled with contacts (e.g., the S/D contacts 524) of the device layer 504. The vias 528b of the first interconnect layer 506 may be coupled with the lines 528a of a second interconnect layer 508.

The second interconnect layer 508 (referred to as Metal 2 or "M2") may be formed directly on the first interconnect layer 506. In some embodiments, the second interconnect layer 508 may include via 528b to couple the lines 528 of the second interconnect layer 508 with the lines 528a of a third interconnect layer 510. Although the lines 528a and the vias 528b are structurally delineated with a line within individual interconnect layers for the sake of clarity, the lines 528a and the vias 528b may be structurally and/or materially contiguous (e.g., simultaneously filled during a dual-damascene process) in some embodiments.

The third interconnect layer 510 (referred to as Metal 3 or "M3") (and additional interconnect layers, as desired) may be formed in succession on the second interconnect layer 508 according to similar techniques and configurations described in connection with the second interconnect layer 508 or the first interconnect layer 506. In some embodiments, the interconnect layers that are "higher up" in the metallization stack 519 in the integrated circuit device 500 (i.e., farther away from the device layer 504) may be thicker that the interconnect layers that are lower in the metallization stack 519, with lines 528a and vias 528b in the higher interconnect layers being thicker than those in the lower interconnect layers.

The integrated circuit device 500 may include a solder resist material 534 (e.g., polyimide or similar material) and one or more conductive contacts 536 formed on the interconnect layers 506-510. In FIG. 5, the conductive contacts 536 are illustrated as taking the form of bond pads. The conductive contacts 536 may be electrically coupled with the interconnect structures 528 and configured to route the electrical signals of the transistor(s) 540 to external devices. For example, solder bonds may be formed on the one or more conductive contacts 536 to mechanically and/or electrically couple an integrated circuit die including the integrated circuit device 500 with another component (e.g., a printed circuit board or a package substrate, e.g., 112). The integrated circuit device 500 may include additional or alternate structures to route the electrical signals from the interconnect layers 506-510; for example, the conductive contacts 536 may include other analogous features (e.g., posts) that route the electrical signals to external components.

In some embodiments in which the integrated circuit device 500 is a double-sided die, the integrated circuit device 500 may include another metallization stack (not shown) on the opposite side of the device layer(s) 504. This metallization stack may include multiple interconnect layers as discussed above with reference to the interconnect layers 506-510, to provide conductive pathways (e.g., including conductive lines and vias) between the device layer(s) 504 and additional conductive contacts (not shown) on the opposite side of the integrated circuit device 500 from the conductive contacts 536.

In other embodiments in which the integrated circuit device 500 is a double-sided die, the integrated circuit device 500 may include one or more through silicon vias (TSVs) through the die substrate 502; these TSVs may make contact with the device layer(s) 504, and may provide conductive pathways between the device layer(s) 504 and additional conductive contacts (not shown) on the opposite side of the integrated circuit device 500 from the conductive contacts 536. In some embodiments, TSVs extending through the substrate can be used for routing power and ground signals from conductive contacts on the opposite side of the integrated circuit device 500 from the conductive contacts 536 to the transistors 540 and any other components integrated into the die 500, and the metallization stack 519 can be used to route I/O signals from the conductive contacts 536 to transistors 540 and any other components integrated into the die 500.

Multiple integrated circuit devices 500 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 6:
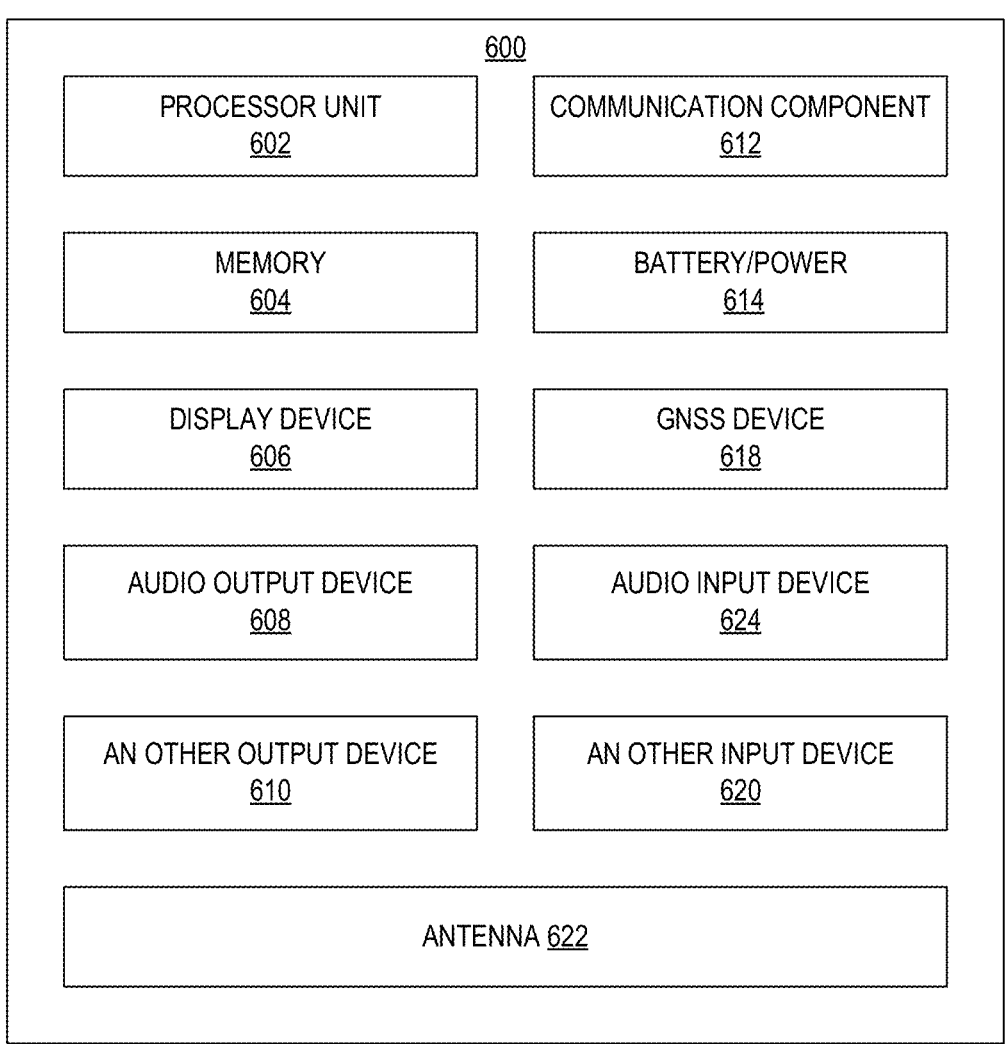
FIG. 6 is a block diagram of an example electrical device that may include a microelectronic assembly, in accordance with any of the embodiments disclosed herein.

FIG. 6 is a block diagram of an example electrical device 600 that may include one or more of the embodiments disclosed herein. For example, any suitable ones of the components of the electrical device 600 may include one or more of assemblies 100, integrated circuit devices 500, or integrated circuit dies 402 disclosed herein. A number of components are illustrated in FIG. 6 as included in the electrical device 600, but any one or more of these components may be omitted or duplicated, as suitable for the application. In some embodiments, some or all of the components included in the electrical device 600 may be attached to one or more motherboards mainboards, or system boards. In some embodiments, one or more of these components are fabricated onto a single system-on-a-chip (SoC) die.

Additionally, in various embodiments, the electrical device 600 may not include one or more of the components illustrated in FIG. 6, but the electrical device 600 may include interface circuitry for coupling to the one or more components. For example, the electrical device 600 may not include a display device 606, but may include display device interface circuitry (e.g., a connector and driver circuitry) to which a display device 606 may be coupled. In another set of examples, the electrical device 600 may not include an audio input device 624 or an audio output device 608, but may include audio input or output device interface circuitry (e.g., connectors and supporting circuitry) to which an audio input device 624 or audio output device 608 may be coupled.

The electrical device 600 may include one or more processor units 602 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 602 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 600 may include a memory 604, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 604 may include memory that is located on the same integrated circuit die as the processor unit 602. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 600 can comprise one or more processor units 602 that are heterogeneous or asymmetric to another processor unit 602 in the electrical device 600. There can be a variety of differences between the processing units 602 in a system in terms of a spectrum of metrics of merit including architectural, micro-architectural, thermal, power consumption characteristics, and the like. These differences can effectively manifest themselves as asymmetry and heterogeneity among the processor units 602 in the electrical device 600.

In some embodiments, the electrical device 600 may include a communication component 612 (e.g., one or more communication components). For example, the communication component 612 can manage wireless communications for the transfer of data to and from the electrical device 600. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 612 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 612 may operate in accordance with other wireless protocols in other embodiments. The electrical device 600 may include an antenna 622 to facilitate wireless communications and/or to receive other wireless communications (such as AM or FM radio transmissions).

In some embodiments, the communication component 612 may manage wired communications, such as electrical, optical, or any other suitable communication protocols (e.g., IEEE 802.3 Ethernet standards). As noted above, the communication component 612 may include multiple communication components. For instance, a first communication component 612 may be dedicated to shorter-range wireless communications such as Wi-Fi or Bluetooth, and a second communication component 612 may be dedicated to longer-range wireless communications such as global positioning system (GPS), EDGE, GPRS, CDMA, WiMAX, LTE, EV-DO, or others. In some embodiments, a first communication component 612 may be dedicated to wireless communications, and a second communication component 612 may be dedicated to wired communications.

The electrical device 600 may include battery/power circuitry 614. The battery/power circuitry 614 may include one or more energy storage devices (e.g., batteries or capacitors) and/or circuitry for coupling components of the electrical device 600 to an energy source separate from the electrical device 600 (e.g., AC line power).

The electrical device 600 may include a display device 606 (or corresponding interface circuitry, as discussed above). The display device 606 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 600 may include an audio output device 608 (or corresponding interface circuitry, as discussed above). The audio output device 608 may include any embedded or wired or wirelessly connected external device that generates an audible indicator, such speakers, headsets, or earbuds.

The electrical device 600 may include an audio input device 624 (or corresponding interface circuitry, as discussed above). The audio input device 624 may include any embedded or wired or wirelessly connected device that generates a signal representative of a sound, such as microphones, microphone arrays, or digital instruments (e.g., instruments having a musical instrument digital interface (MIDI) output). The electrical device 600 may include a Global Navigation Satellite System (GNSS) device 618 (or corresponding interface circuitry, as discussed above), such as a Global Positioning System (GPS) device. The GNSS device 618 may be in communication with a satellite-based system and may determine a geolocation of the electrical device 600 based on information received from one or more GNSS satellites, as known in the art.

The electrical device 600 may include another output device 610 (or corresponding interface circuitry, as discussed above). Examples of the other output device 610 may include an audio codec, a video codec, a printer, a wired or wireless transmitter for providing information to other devices, or an additional storage device.

The electrical device 600 may include another input device 620 (or corresponding interface circuitry, as discussed above). Examples of the other input device 620 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 600 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 600 may be any other electronic device that processes data. In some embodiments, the electrical device 600 may comprise multiple discrete physical components. Given the range of devices that the electrical device 600 can be manifested as in various embodiments, in some embodiments, the electrical device 600 can be referred to as a computing device or a computing system.

Illustrative examples of the technologies described throughout this disclosure are provided below. Embodiments of these technologies may include any one or more, and any combination of, the examples described below. In some embodiments, at least one of the systems or components set forth in one or more of the preceding figures may be configured to perform one or more operations, techniques, processes, and/or methods as set forth in the following examples.

Example 1 is an apparatus comprising: a substrate comprising: electrical contacts on a first side of the substrate to couple the substrate to an integrated circuit die; a passivation layer on a second side of the substrate opposite the first side, the passivation layer defining a plurality of openings exposing the second side of the substrate; metal pads on the second side of the substrate and within the openings defined by the passivation layer; and solder bumps on the metal pads, the solder bumps comprising a material resistant to Gallium-based liquid metal embrittlement.

Example 2 includes the subject matter of Example 1, wherein the wherein the material resistant to Gallium-based liquid metal embrittlement comprises Tin, Copper, and Bismuth.

Example 3 includes the subject matter of Example 1 or 2, wherein the material resistant to Gallium-based liquid metal embrittlement comprises an intermetallic compound (IMC) comprising Tin and Copper.

Example 4 includes the subject matter of Example 2, wherein the solder bumps comprise between 20-40% Tin, 20-40% Copper, and 20-40% Bismuth.

Example 5 includes the subject matter of any one of Examples 1-4, wherein the metal pads are positioned on the second side of the substrate such that trenches are defined between the metal pads and the passivation layer.

Example 6 includes the subject matter of any one of Examples 1-5, further comprising an integrated circuit die coupled to the substrate on the first side of the substrate.

Example 7 includes the subject matter of Example 6, further comprising: a thermal interface material on the integrated circuit die; and a cap coupled to the second side of the substrate, wherein the integrated circuit die and the thermal interface material are between the cap and the second side of the substrate.

Example 8 includes the subject matter of any one of Examples 1-7, further comprising: an interposer coupled to the substrate on the second side of the substrate, the interposer comprising: a housing defining a set of holes; an adhesive layer on a first side of the housing, the adhesive layer in contact with the passivation layer; a barrier layer on a second side of the housing opposite the first side, the barrier layer enclosing the holes on the second side of the housing; and Gallium-based liquid metal within the holes and in contact with the solder bumps.

Example 9 includes a system comprising a main board; a socket coupled to the main board, the socket comprising a set of pins extending from the socket in a direction opposite the main board; a package coupled to the socket, the package comprising: a substrate; an integrated circuit die on a first side of the substrate; metal pads on a second side of the substrate opposite the first side; solder bumps on the metal pads, the solder bumps comprising a material resistant to Gallium-based liquid metal embrittlement; and an interposer comprising a Gallium-based liquid metal in each of a set of reservoirs defined within the interposer, the Gallium-based liquid metal in each reservoir in contact with a respective solder bump; wherein the pins of the socket are within the reservoirs of the interposer and in contact with the Gallium-based liquid metal.

Example 10 includes the subject matter of Example 9, wherein the wherein the material resistant to Gallium-based liquid metal embrittlement comprises Tin, Copper, and Bismuth.

Example 11 includes the subject matter of Example 9 or 10, wherein the material resistant to Gallium-based liquid metal embrittlement comprises an intermetallic compound (IMC) comprising Tin and Copper.

Example 12 includes the subject matter of Example 10, wherein the solder bumps comprise between 20-40% Tin, 20-40% Copper, and 20-40% Bismuth.

Example 13 includes the subject matter of any one of Examples 9-13, wherein the substrate further comprises a passivation layer on the second side of the substrate, the passivation layer defining a plurality of trenches between the metal pads and the second side of the substrate.

Example 14 includes the subject matter of any one of Examples 9-13, wherein the package further comprises: a thermal interface material on the integrated circuit die; and a cap coupled to the second side of the substrate, wherein the integrated circuit die and the thermal interface material are between the cap and the second side of the substrate.

Example 15 includes a method of manufacturing an integrated circuit apparatus comprising: forming a substrate; forming electrical contacts on a first side of the substrate; forming a passivation layer on a second side of the substrate opposite the first side; forming openings in the passivation layer exposing the second side of the substrate; forming metal pads on the second side of the substrate within the openings in the passivation layer; depositing solder paste on the metal pads, the solder paste comprising Tin, Copper, and Bismuth; and exposing the solder paste to gas comprising Nitrogen and heat to form an intermetallic compound comprising Tin and Copper.

Example 16 includes the subject matter of Example 15, wherein the solder paste comprises between 20-40% Tin, 20-40% Copper, and 20-40% Bismuth.

Example 17 includes the subject matter of Example 15 or 16, wherein the solder paste is deposited using one or more of a printing process, a dipping process, or a jetting process.

Example 18 includes the subject matter of any one of Examples 15-17, wherein exposing the solder paste to heat comprises exposing the solder bumps to a temperature between 180-250° C.

Example 19 includes the subject matter of any one of Examples 15-18, wherein the metal pads are formed such that there are trenches remaining between the metal pads and the passivation layer.

Example 20 includes the subject matter of any one of Examples 15-19, further comprising: coupling an integrated circuit die to the first side of the substrate; depositing a thermal interface material on the integrated circuit die; and attaching a cap to the first side of the substrate such that the integrated circuit die and the thermal interface material are between the cap and the substrate.

Example 21 includes the subject matter of Example 20, wherein the solder paste is deposited after coupling the integrated circuit die to the substrate.

Example 22 includes a product made by the process comprising any one of Examples 15-21.

Example 23 includes an apparatus comprising a substrate comprising: electrical contacts on a first side of the substrate to couple the substrate to an integrated circuit die; a dielectric layer on a second side of the substrate opposite the first side, the dielectric layer defining a plurality of openings exposing the second side of the substrate; metal pads on the second side of the substrate and within the openings defined by the dielectric layer; and solder bumps on the metal pads, the solder bumps comprising Tin, Copper, and Bismuth.

Example 24 includes the subject matter of claim 14, wherein the solder bumps comprise an intermetallic compound (IMC) comprising Tin and Copper.

Example 25 includes the subject matter of claim 14, wherein the solder bumps comprise between 20-40% Tin, 20-40% Copper, and 20-40% Bismuth.

Example 26 includes the subject matter of claim 14, wherein the metal pads are positioned on the second side of the substrate such that trenches are defined between the metal pads and the passivation layer.

Example 27 includes the subject matter of claim 14, further comprising an integrated circuit die coupled to the substrate on the first side of the substrate.

Example 28 includes the subject matter of claim 14, further comprising an interposer comprising a Gallium-based liquid metal in each of a set of reservoirs defined within the interposer, wherein each solder bump is in contact with the Gallium-based liquid metal in a reservoir of the interposer.

Example 29 includes a system comprising: a main board; a socket coupled to the main board, the socket comprising a set of pins extending from the socket in a direction opposite the main board; a package coupled to the socket, the package comprising any one of Examples 23-27.

In the above description, various aspects of the illustrative implementations have been described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials, and configurations have been set forth to provide a thorough understanding of the illustrative implementations. However, it will be apparent to one skilled in the art that the present disclosure may be practiced without all of the specific details. In other instances, well-known features have been omitted or simplified in order not to obscure the illustrative implementations.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The above description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

The invention claimed is:

1. An apparatus comprising:
a substrate comprising:
electrical contacts on a first side of the substrate to couple the substrate to an integrated circuit die;
a passivation layer on a second side of the substrate opposite the first side, the passivation layer defining a plurality of openings exposing the second side of the substrate;
metal pads on the second side of the substrate and within the openings defined by the passivation layer; and
solder bumps on the metal pads, the solder bumps comprising an intermetallic compound (IMC) resistant to Gallium-based liquid metal embrittlement, wherein the IMC comprises Tin and Copper and the solder bumps comprise between 20-40% Tin, 20-40% Copper, and 20-40% Bismuth.

2. The apparatus of claim 1, wherein the metal pads are positioned on the second side of the substrate such that trenches are defined between metal pads and the passivation layer.

3. The apparatus of claim 1, further comprising an integrated circuit die coupled to the substrate on the first side of the substrate.

4. The apparatus of claim 3, further comprising:
a thermal interface material on the integrated circuit die; and
a cap coupled to the second side of the substrate, wherein the integrated circuit die and the thermal interface material are between the cap and the second side of the substrate.

5. The apparatus of claim 1, further comprising:
an interposer coupled to the substrate on the second side of the substrate, the interposer comprising:
a housing defining a set of holes;
an adhesive layer on a first side of the housing, the adhesive layer in contact with the passivation layer;
a barrier layer on a second side of the housing opposite the first side, the barrier layer enclosing the holes on the second side of the housing; and
Gallium-based liquid metal within the holes and in contact with the solder bumps.

6. A system comprising:
a main board;
a socket coupled to the main board, the socket comprising a set of pins extending from the socket in a direction opposite the main board;
a package coupled to the socket, the package comprising:
a substrate;
an integrated circuit die on a first side of the substrate;
metal pads on a second side of the substrate opposite the first side;
solder bumps on the metal pads, the solder bumps comprising an intermetallic compound (IMC) resistant to Gallium-based liquid metal embrittlement, wherein the IMC comprises Tin and Copper and the solder bumps comprise between 20-40% Tin, 20-40% Copper, and 20-40% Bismuth; and
an interposer comprising a Gallium-based liquid metal in each of a set of reservoirs defined within the interposer, the Gallium-based liquid metal in each reservoir in contact with a respective solder bump;
wherein the pins of the socket are within the reservoirs of the interposer and in contact with the Gallium-based liquid metal.

7. The system of claim 6, wherein the substrate further comprises a passivation layer on the second side of the substrate, the passivation layer defining a plurality of trenches between the metal pads and the second side of the substrate.

8. The system of claim 6, wherein the package further comprises:
a thermal interface material on the integrated circuit die; and
a cap coupled to the second side of the substrate, wherein the integrated circuit die and the thermal interface material are between the cap and the second side of the substrate.

9. An apparatus comprising:
a substrate comprising:
electrical contacts on a first side of the substrate to couple the substrate to an integrated circuit die;
a dielectric layer on a second side of the substrate opposite the first side, the dielectric layer defining a plurality of openings exposing the second side of the substrate;
metal pads on the second side of the substrate and within the openings defined by the dielectric layer; and
solder bumps on the metal pads, the solder bumps comprising an intermetallic compound (IMC) comprising Tin and Copper and further comprising Bismuth, wherein the solder bumps comprise between 20-40% Tin, 20-40% Copper, and 20-40% Bismuth.

10. The apparatus of claim 9, wherein the metal pads are positioned on the second side of the substrate such that trenches are defined between the metal pads and the dielectric layer.

11. The apparatus of claim 9, further comprising an integrated circuit die coupled to the substrate on the first side of the substrate.

12. The apparatus of claim 9, further comprising an interposer comprising a Gallium-based liquid metal in each of a set of reservoirs defined within the interposer, wherein each solder bump is in contact with the Gallium-based liquid metal in a reservoir of the interposer.

13. A product made by a process comprising:

forming a substrate;

forming electrical contacts on a first side of the substrate;

forming a passivation layer on a second side of the substrate opposite the first side;

forming openings in the passivation layer exposing the second side of the substrate;

forming metal pads on the second side of the substrate within the openings in the passivation layer;

depositing solder paste on the metal pads, the solder paste comprising Tin, Copper, and Bismuth, wherein the solder paste comprises between 20-40% Tin, 20-40% Copper, and 20-40% Bismuth; and exposing the solder paste to gas comprising Nitrogen and heat to form an intermetallic compound comprising Tin and Copper.

14. The product of claim 13, wherein exposing the solder paste to heat comprises exposing the solder paste to a temperature between 180-250° C.

15. The product of claim 13, wherein the process further comprises coupling an integrated circuit die to the first side of the substrate;

depositing a thermal interface material on the integrated circuit die; and attaching a cap to the first side of the substrate such that the integrated circuit die and the thermal interface material are between the cap and the substrate;

wherein the solder paste is deposited after coupling the integrated circuit die to the substrate.

\* \* \* \* \*